United States Patent
Meyer et al.

(10) Patent No.: US 7,294,899 B2
(45) Date of Patent: Nov. 13, 2007

(54) NANOWIRE FILAMENT

(75) Inventors: Neal W. Meyer, Corvallis, OR (US); James E. Ellenson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 106 days.

(21) Appl. No.: 11/142,103

(22) Filed: Jun. 1, 2005

(65) Prior Publication Data

US 2006/0076644 A1    Apr. 13, 2006

Related U.S. Application Data

(62) Division of application No. 10/326,708, filed on Dec. 20, 2002, now Pat. No. 6,936,496.

(51) Int. Cl.
    *H01L 31/058*    (2006.01)
(52) U.S. Cl. ............... 257/467; 257/536; 257/E23.141
(58) Field of Classification Search ................ 257/467, 257/536, 537, E23.141
    See application file for complete search history.

(56) References Cited

U.S. PATENT DOCUMENTS

| | | |
|---|---|---|
| 2,744,970 A | 5/1956 | Shockley |
| 2,939,057 A | 5/1960 | Teszner |
| 5,008,616 A | 4/1991 | Lauks et al. |
| 5,118,801 A | 6/1992 | Lizardi et al. |
| 5,202,290 A | 4/1993 | Moskovits |
| 5,237,523 A | 8/1993 | Bonne et al. |
| 5,330,612 A | 7/1994 | Watanabe |
| 5,418,558 A | 5/1995 | Hock et al. |
| 5,563,760 A * | 10/1996 | Lowis et al. ............ 361/103 |
| 5,591,896 A | 1/1997 | Lin |
| 5,622,825 A | 4/1997 | Law et al. |
| 5,747,180 A | 5/1998 | Miller et al. |
| 5,767,521 A | 6/1998 | Takeno et al. |
| 5,780,710 A | 7/1998 | Murase et al. |
| 5,837,454 A | 11/1998 | Cozzette et al. |
| 5,837,466 A | 11/1998 | Lane et al. |
| 5,843,653 A | 12/1998 | Gold et al. |
| 5,869,244 A | 2/1999 | Martin et al. |
| 5,918,110 A | 6/1999 | Abraham-Fuchs et al. |
| 5,972,710 A | 10/1999 | Weigl et al. |

(Continued)

FOREIGN PATENT DOCUMENTS

JP    2002-335021    11/2002

(Continued)

OTHER PUBLICATIONS

Choi, et al; "Sublighographic nanofabrication technology for nanocatalysts and DNA Chips"; J. Vac. Sci. Technol. B 21 (6), Nov./Dec. 2003; pp. 2951-2955.

(Continued)

*Primary Examiner*—T. N. Quach

(57) ABSTRACT

A method of manufacturing a nanowire filament includes forming and fusing actions. In a forming action, close proximity conductors are formed. In another forming action, a junction oxide is formed between the close proximity conductors. In a fusing action, a nanowire filament is fused between the close proximity conductors, through the junction oxide. A circuit is also provided, having first and second close proximity conductors, and a nanowire filament fused between the close proximity conductors.

21 Claims, 9 Drawing Sheets

U.S. PATENT DOCUMENTS

Figure 1:
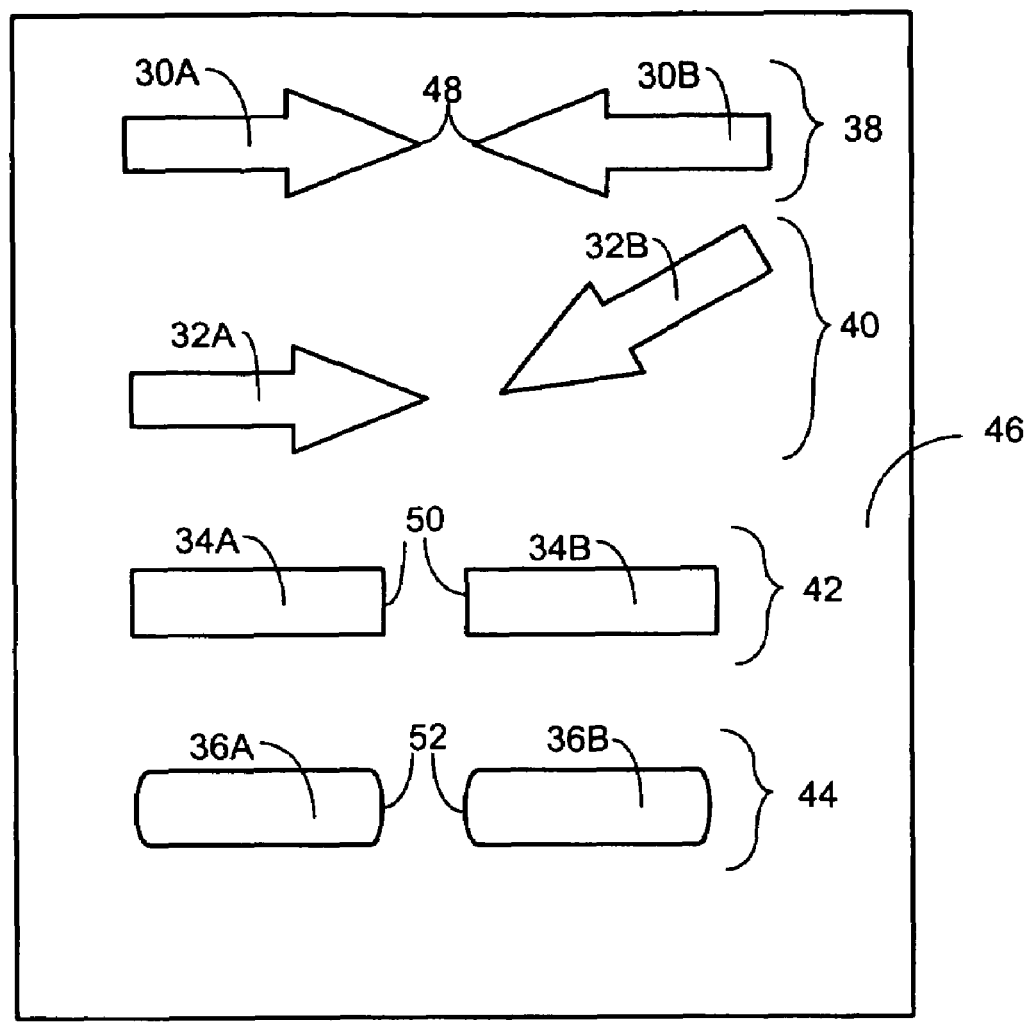

| | | | |
|---|---|---|---|
| 5,997,958 A | 12/1999 | Sato et al. | |
| 6,034,389 A | 3/2000 | Burns, Jr. et al. | |
| 6,120,844 A | 9/2000 | Chen et al. | |
| 6,150,097 A | 11/2000 | Tyagi et al. | |
| 6,150,106 A | 11/2000 | Martin et al. | |
| 6,231,744 B1 | 5/2001 | Ying et al. | |
| 6,238,085 B1 | 5/2001 | Higashi et al. | |
| 6,256,767 B1 | 7/2001 | Kuekes et al. | |
| 6,294,450 B1 | 9/2001 | Chen et al. | |
| 6,355,436 B1 | 3/2002 | Martin et al. | |
| 6,359,288 B1 | 3/2002 | Ying et al. | |
| 6,360,582 B1 | 3/2002 | Chelvayohan et al. | |
| 6,365,059 B1 | 4/2002 | Pechenik | |
| 6,407,443 B2 | 6/2002 | Chen et al. | |
| 6,438,501 B1 | 8/2002 | Szecsody et al. | |
| 6,445,006 B1 * | 9/2002 | Brandes et al. | 257/76 |
| 6,482,639 B2 | 11/2002 | Snow et al. | |
| 6,521,109 B1 | 2/2003 | Bartic et al. | |
| 6,562,577 B2 | 5/2003 | Martin et al. | |
| 6,680,377 B1 | 1/2004 | Stanton et al. | |
| 7,098,393 B2 * | 8/2006 | Fleurial et al. | 136/240 |
| 2001/0046674 A1 | 11/2001 | Ellington | |
| 2002/0012937 A1 | 1/2002 | Tender et al. | |
| 2002/0061536 A1 | 5/2002 | Martin et al. | |
| 2002/0117659 A1 * | 8/2002 | Lieber et al. | 257/14 |
| 2002/0130353 A1 * | 9/2002 | Lieber et al. | 257/315 |
| 2002/0179434 A1 * | 12/2002 | Dai et al. | 204/242 |
| 2003/0089899 A1 | 5/2003 | Lieber et al. | |
| 2003/0132461 A1 | 7/2003 | Roesner et al. | |
| 2003/0148562 A1 | 8/2003 | Luyken et al. | |
| 2003/0152759 A1 * | 8/2003 | Chao et al. | 428/307.3 |
| 2003/0162190 A1 | 8/2003 | Gorenstein et al. | |
| 2003/0170650 A1 | 9/2003 | Karube et al. | |
| 2003/0186522 A1 | 10/2003 | Duan et al. | |
| 2003/0189202 A1 | 10/2003 | Li et al. | |
| 2003/0219801 A1 | 11/2003 | Lipshutz | |
| 2003/0224435 A1 | 12/2003 | Seiwert | |
| 2004/0005723 A1 * | 1/2004 | Empedocles et al. | 438/1 |
| 2004/0005923 A1 | 1/2004 | Allard et al. | |
| 2004/0007740 A1 | 1/2004 | Abstreiter et al. | |
| 2004/0009510 A1 | 1/2004 | Seiwert et al. | |
| 2004/0028936 A1 | 2/2004 | Kogiso et al | |
| 2004/0031975 A1 | 2/2004 | Kern et al. | |
| 2004/0043527 A1 | 3/2004 | Bradley et al. | |
| 2005/0064618 A1 * | 3/2005 | Brown et al. | 438/49 |
| 2006/0175601 A1 * | 8/2006 | Lowis et al. | 257/19 |

FOREIGN PATENT DOCUMENTS

| | | |
|---|---|---|
| JP | 2002-361600 | 12/2002 |
| WO | WO02/48701 | 6/2002 |
| WO | WO02/92505 | 11/2002 |

OTHER PUBLICATIONS

Melosh, Nicholas A. et al., "Ultrahigh-Density Nanowire Lattices and Circuits," California Nanosystems Institute, University of California, Sciencexpress Report, Sciencexpress/www.sciencexpress.org/13 Mar. 2003 / 10.1126/ science. 1081940, pp. 1-4.

Coleman, J. N. et al., "Percolation-dominated conductivity in a conjugated-polymer-carbon-nanotube composite," Rapid Communications, Physical Review B, vol. 58, No. 12, Sep. 15, 1998, The American Physical Society, pp. R7492-R7495.

Covington et al., "A Polymer gate FET sensor array for detecting organic vapours," Sensor and Actuators B 77, Elsevier Science, 2001, pp. 155-162.

* cited by examiner

NANOWIRE FILAMENT

CROSS REFERENCE TO RELATED APPLICATIONS

This is a division of U.S. patent application Ser. No. 10/326,708 filed Dec. 20, 2002 U.S. Pat. No. 6,936,496 titled Array of Nanowire Filament.

INTRODUCTION

There is an increasing interest in chemical, biological, micromechanical, microelectronic, and microfluidic monitoring and sensing. Awareness and concern about factors which influence health, safety, appliance performance, and the environment create a need for technologies capable of detecting, identifying, and monitoring chemical, biological, and environmental conditions in real-time, on smaller scales, and in smaller packages.

In response to these needs, a successful commercial market focused on exploiting, simplifying, improving, and cost-reducing sophisticated laboratory procedures and hardware has emerged. Home carbon monoxide monitors, drinking water purity monitors, and smoke detectors are now very common. Many of these devices have become requirements for new construction. In addition to environmental sensor products, there is a rapidly growing market focused on personal health monitors and health screening devices. For example, there are a number of systems on the market which are capable of sampling and analyzing blood for glucose monitoring. Analogous to the computing revolution, the evolution from centralized sensing to distributed and embedded sensing is underway. Given these trends, it is safe to predict that intelligent, portable, wireless, web-enabled, self-diagnostic products which exploit a broad range of chemical, environmental, and biological sensor technology will be in demand in the near future. Furthermore, there will be demand for smaller and smaller sensors and sensing devices, even on a nano-scale.

In each of the applications above, and with others, there is and will be an ever-increasing demand for lower detection limits, higher selectivity and sensitivity, portability, and real-time response.

DRAWINGS

FIG. 1 schematically illustrates several embodiments of conductors which are in close proximity pairs.

Figure 2A:
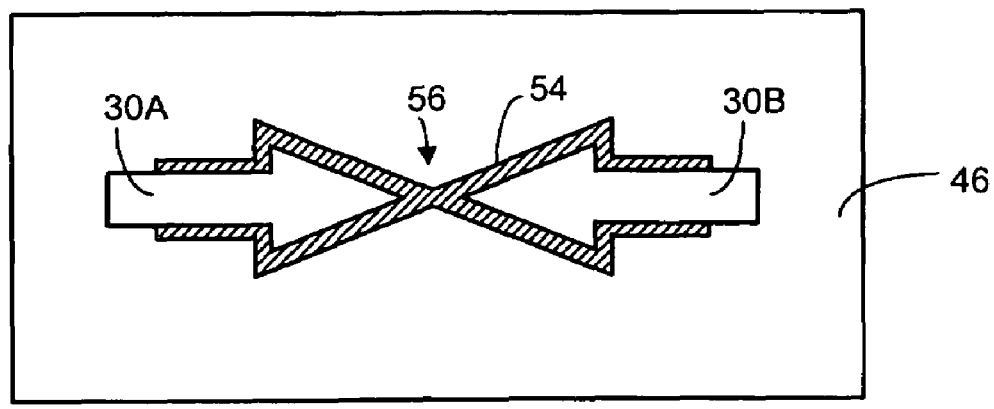
Figure 2B:
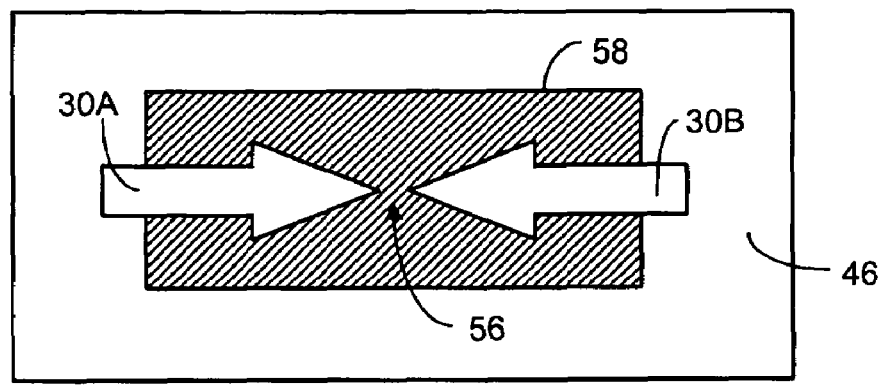

FIGS. 2A and 2B schematically illustrate two embodiments of close proximity conductors which have been oxidized or on which oxides have been deposited.

Figure 3:
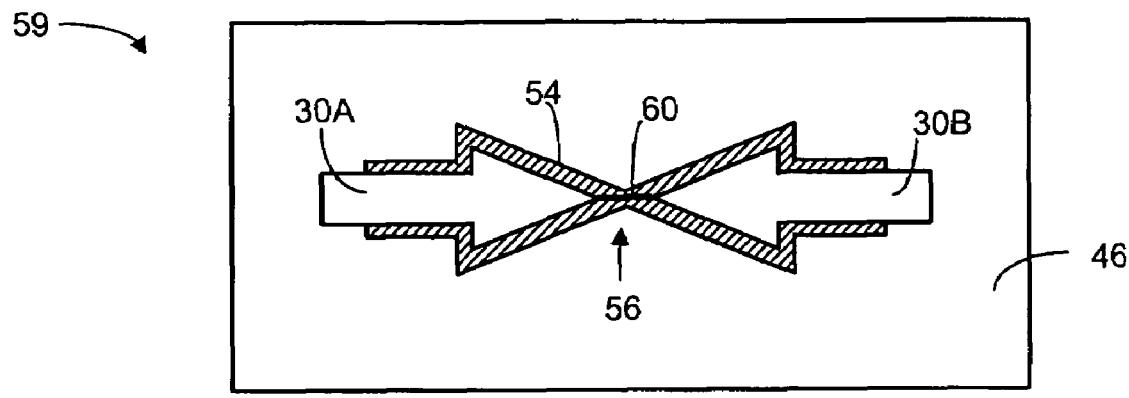
Figure 4A:
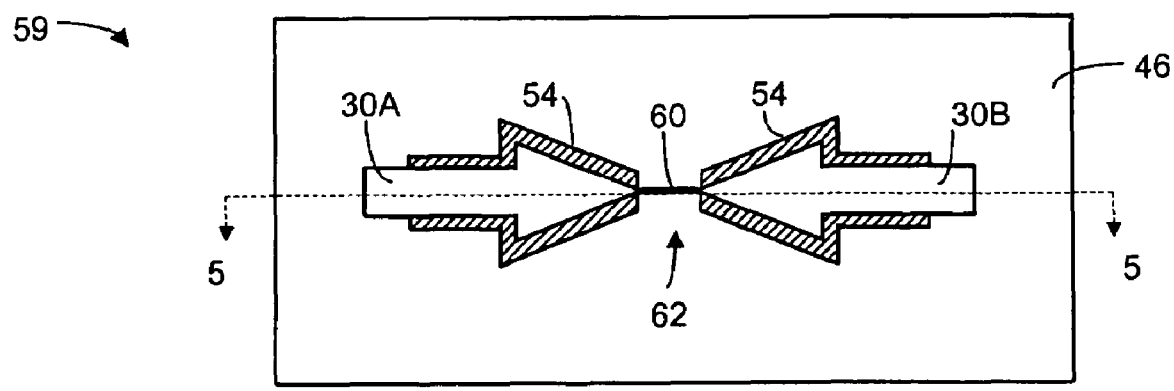
Figure 4B:
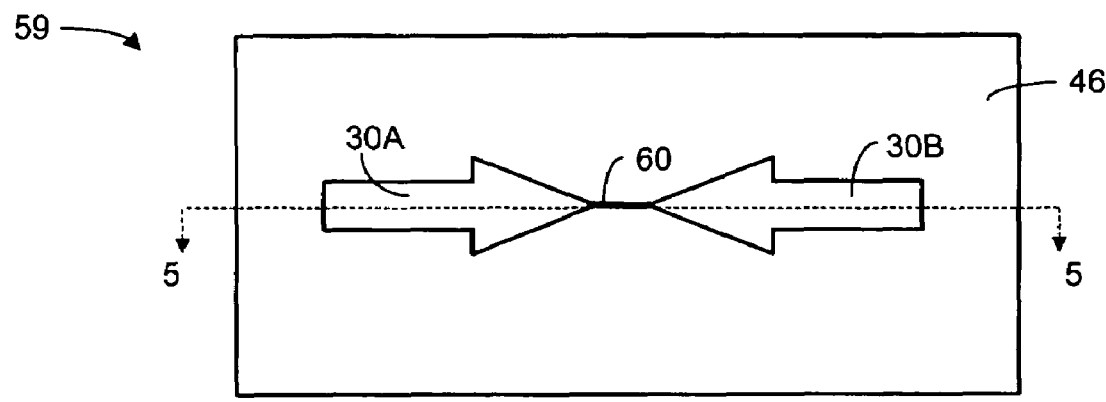

FIGS. 3, 4A, and 4B schematically illustrate, in a top view, embodiments of a nanowire filament between embodiments of close proximity conductors.

Figure 5A:
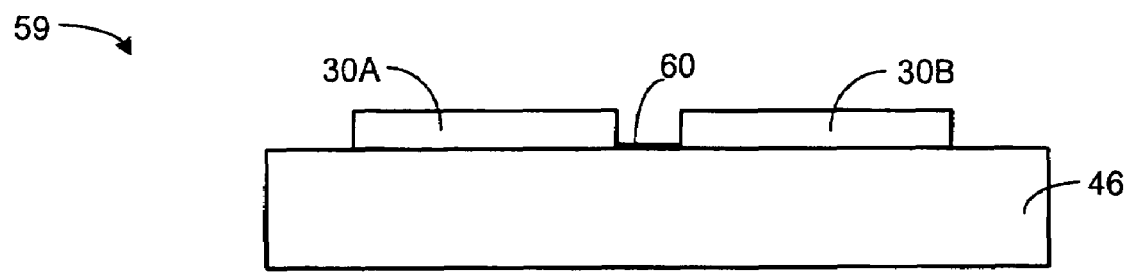

FIG. 5A schematically illustrates, in a side cross-sectional view, an embodiment of a nanowire filament between embodiments of close proximity conductors.

Figure 5B:
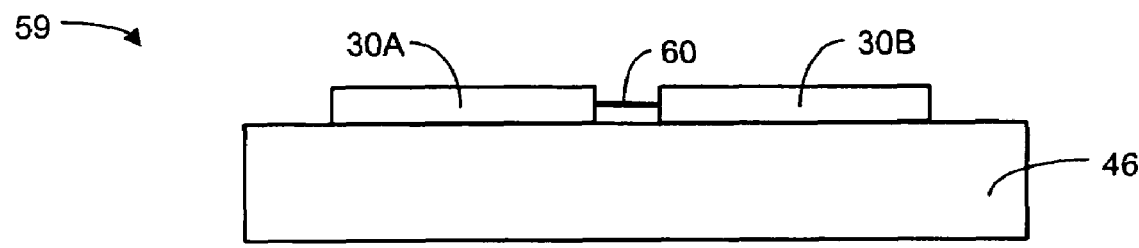

FIG. 5B schematically illustrates, in a side cross-sectional view, an embodiment of a suspended nanowire filament between embodiments of close proximity conductors.

Figure 6:
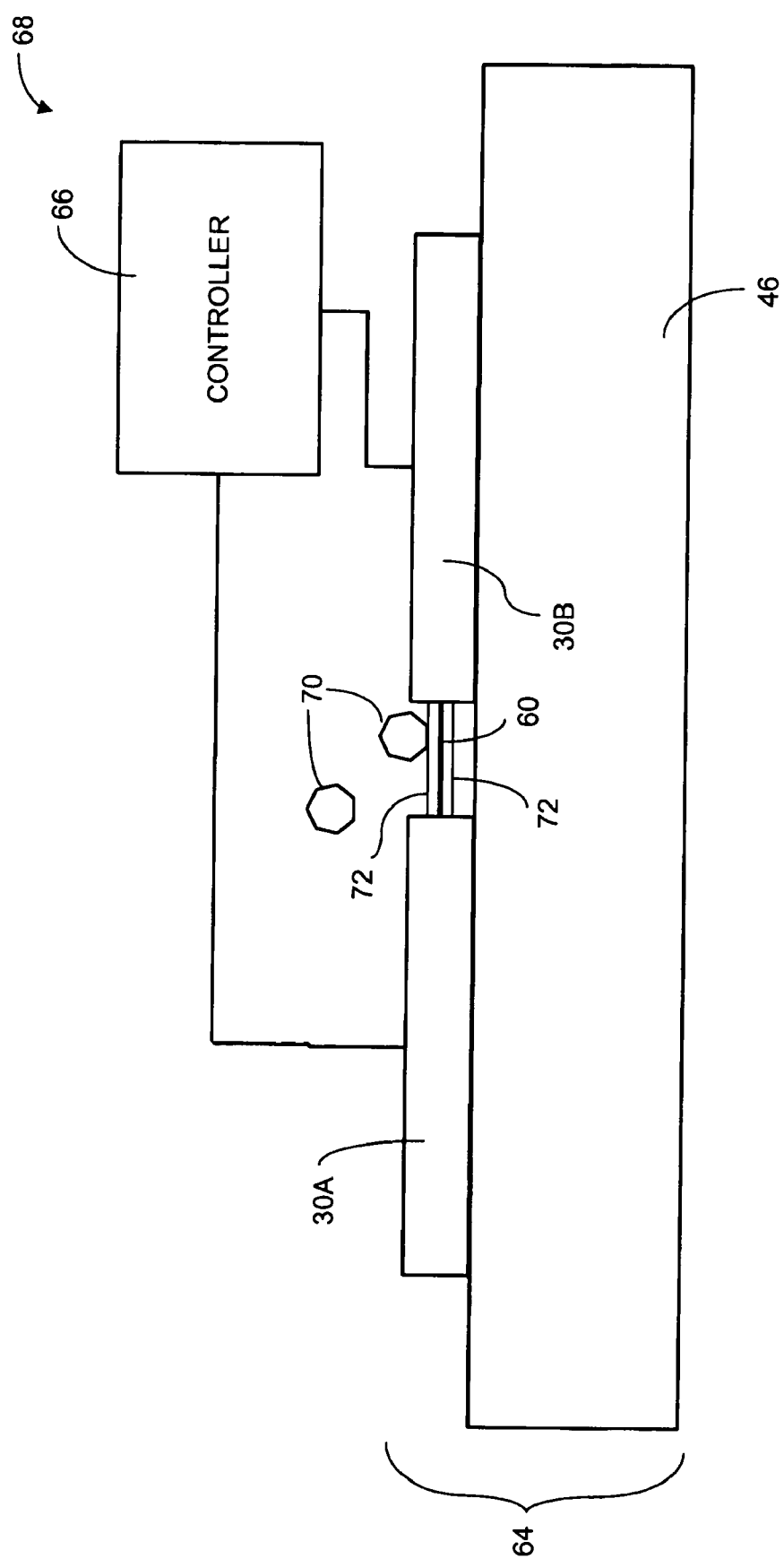

FIG. 6 schematically illustrates an embodiment of a treated nanowire filament used as a sensor.

Figure 7:
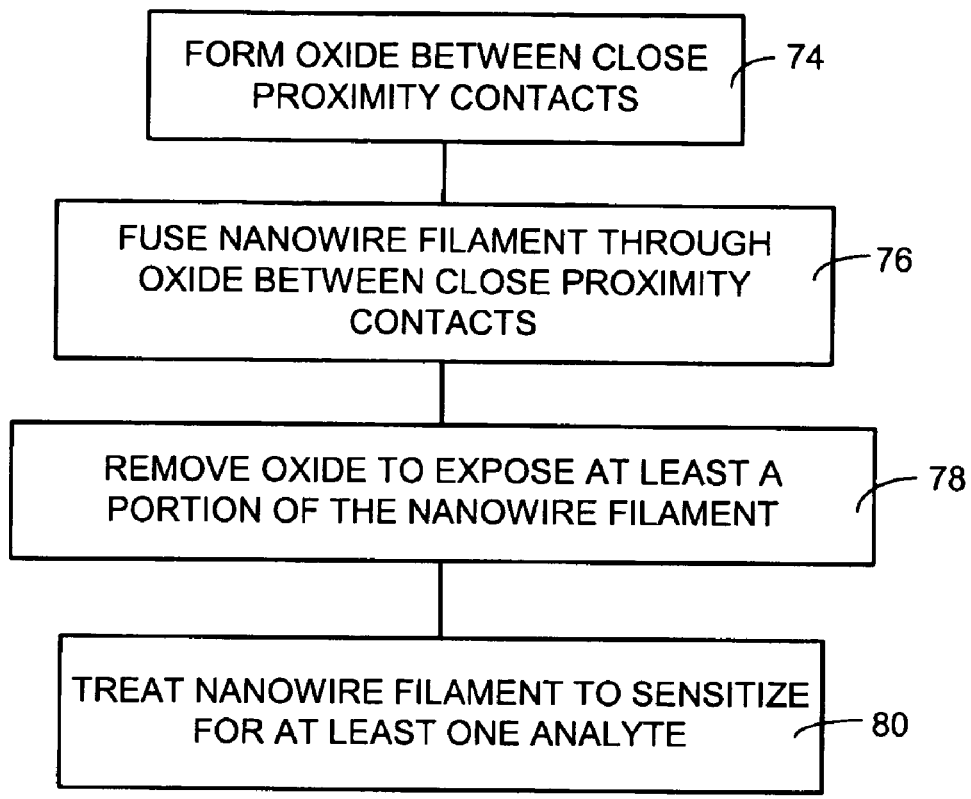

FIG. 7 illustrates an embodiment of actions which may be used to construct a treated nanowire filament.

Figure 8:
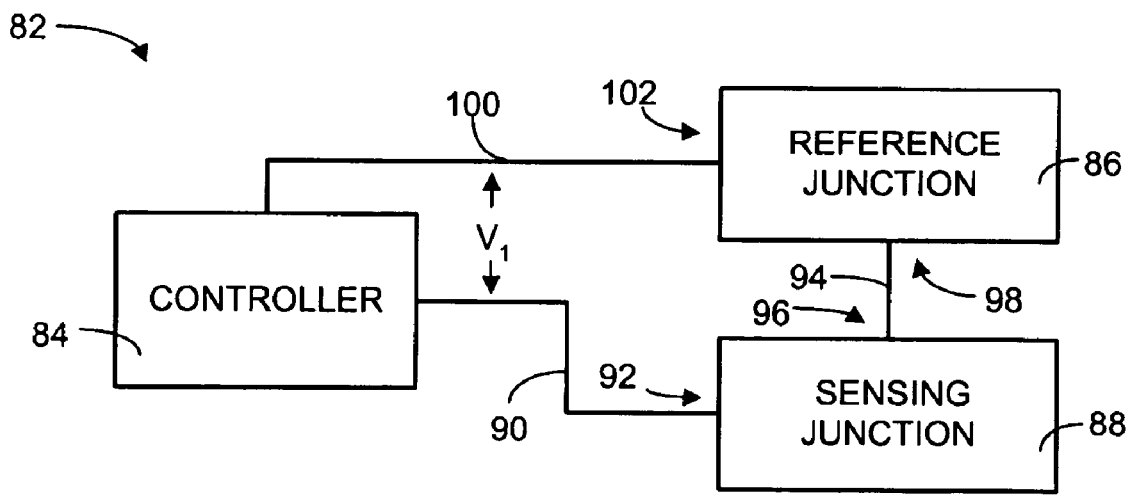

FIG. 8 schematically illustrates an embodiment of a temperature measurement device.

Figure 9:
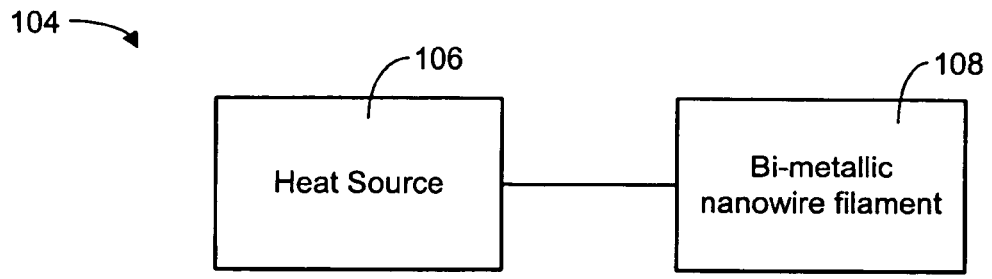

FIG. 9 schematically illustrates an embodiment of a thermocouple reference junction.

Figure 10:
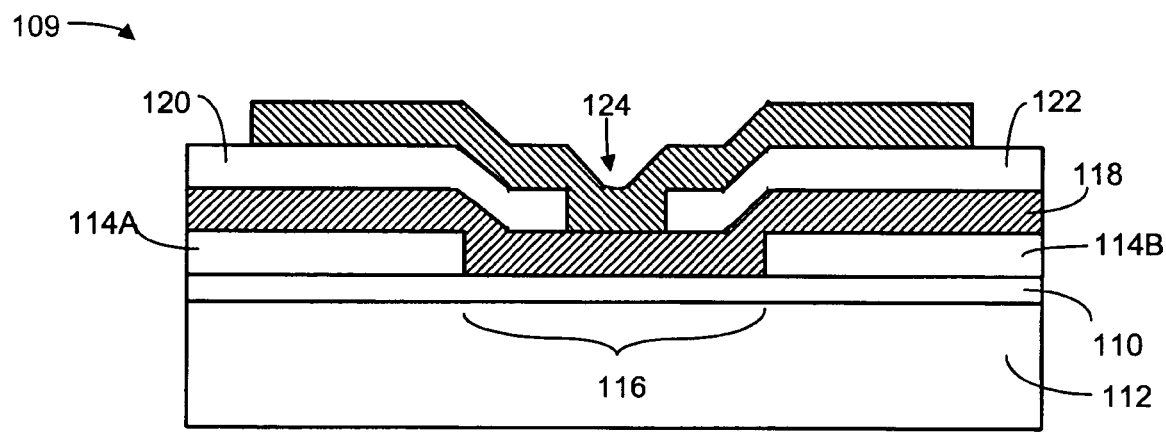

FIG. 10 schematically illustrates, in side cross-sectional view, an embodiment of a heat source coupled to embodiments of close proximity conductors.

Figure 11:
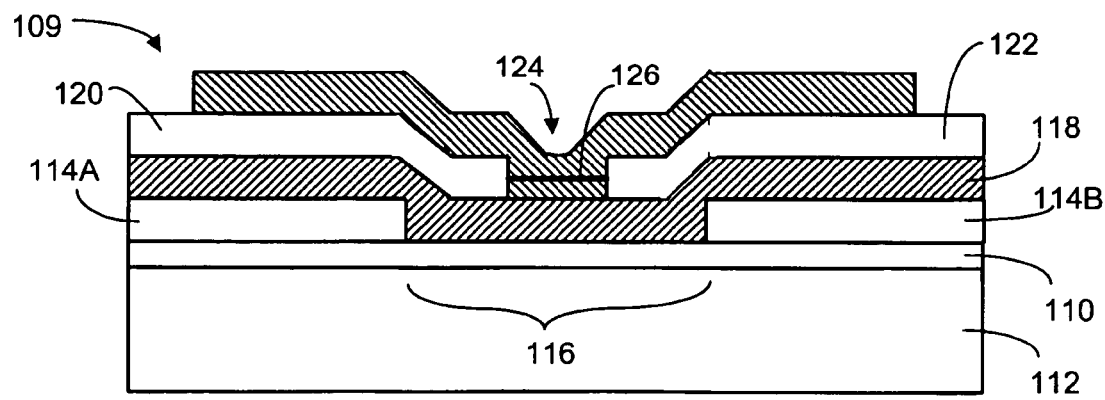

FIG. 11 schematically illustrates, in side cross-sectional view, an embodiment of a thermocouple reference junction.

Figure 12:
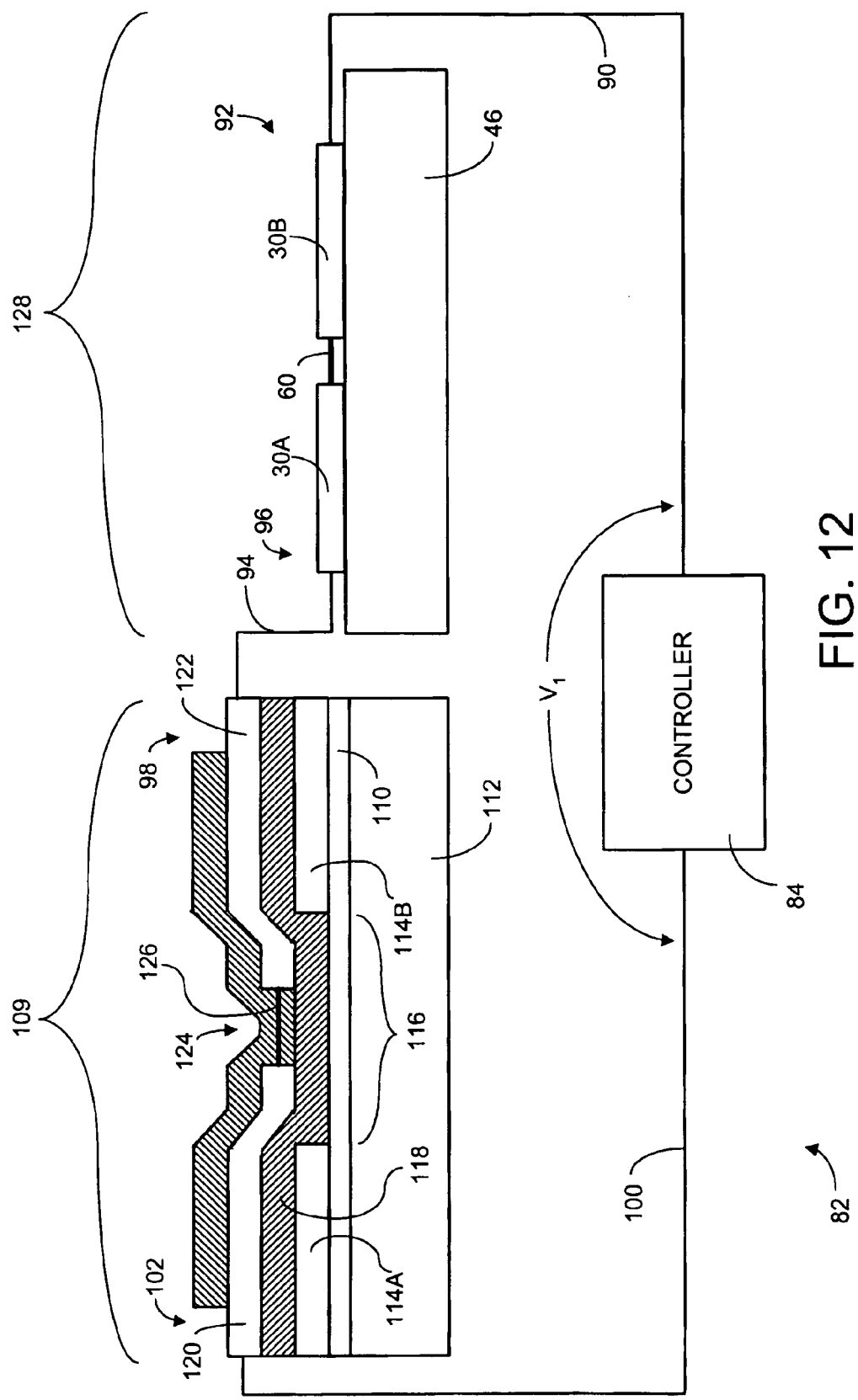

FIG. 12 schematically illustrates an embodiment of a temperature measurement device.

Figure 13:
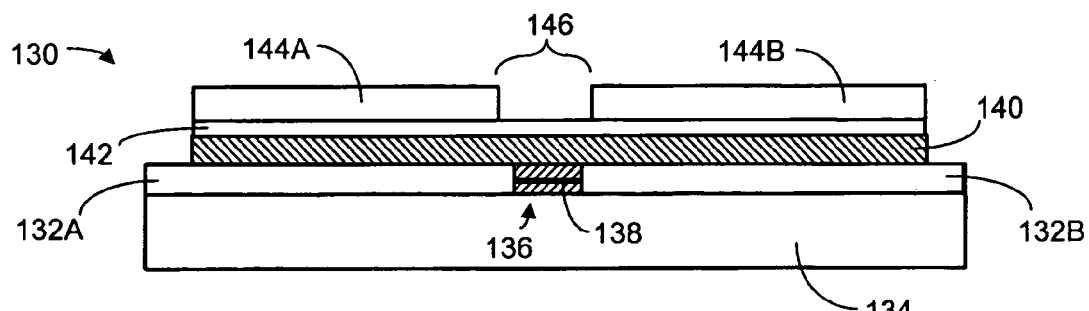

FIG. 13 schematically illustrates, in side cross-sectional view, an embodiment of a thermocouple reference junction.

Figure 14:
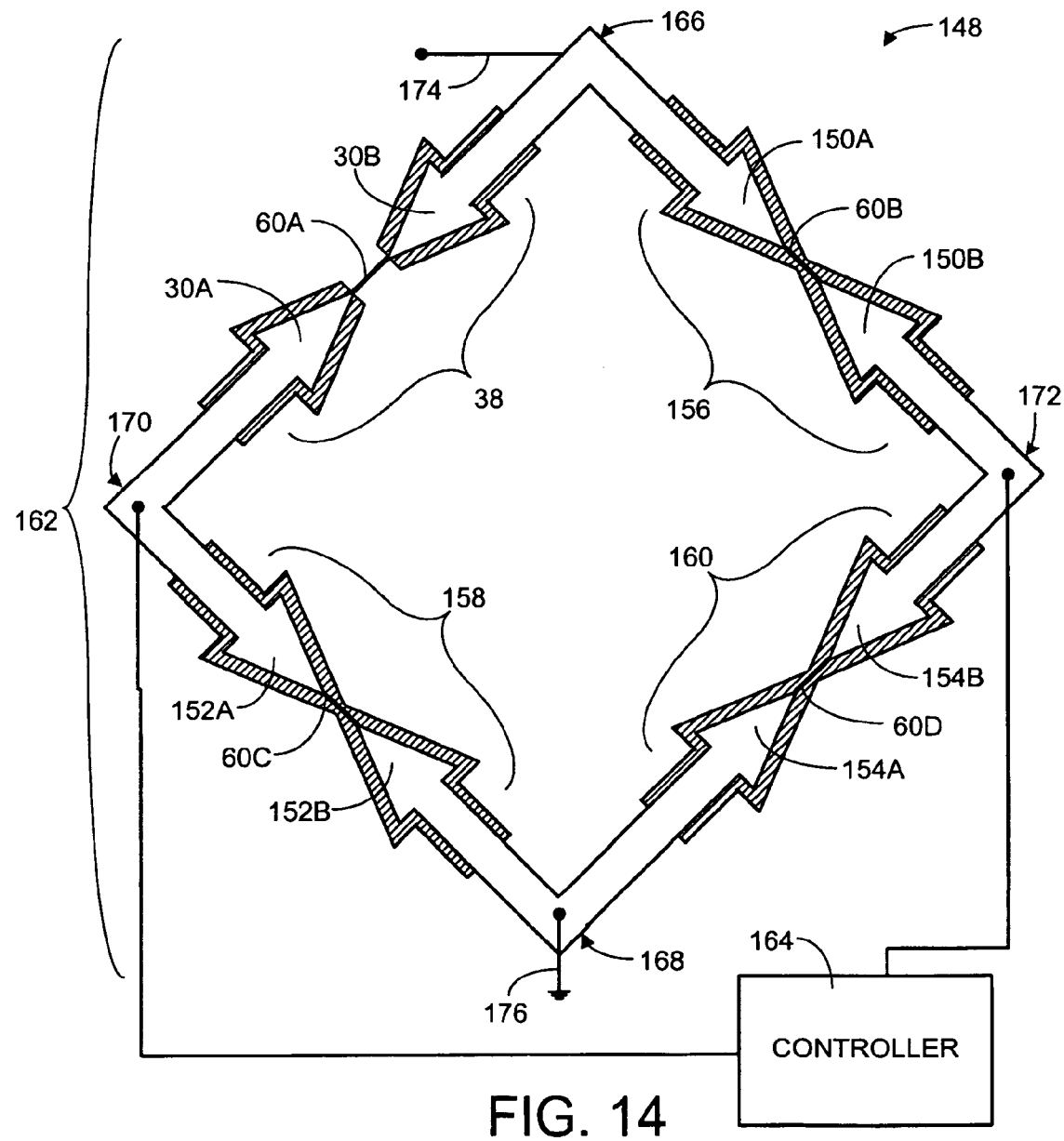
Figure 15:
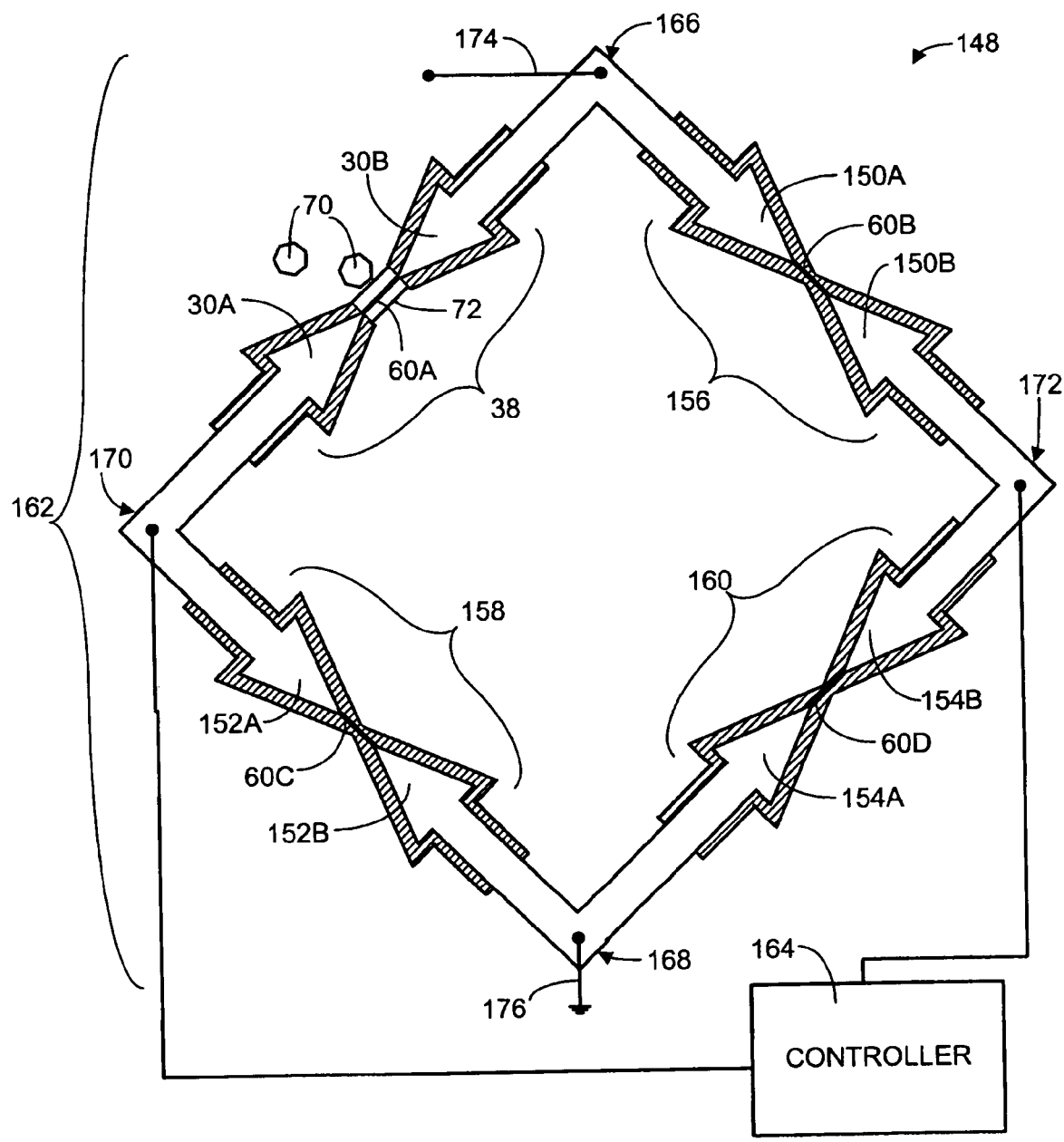

FIGS. 14-15 schematically illustrate embodiments of a nanowire sensor circuit.

DETAILED DESCRIPTION

FIG. 1 schematically illustrates, in a top view, several embodiments of conductors 30A, 30B, 32A, 32B, 34A, 34B, 36A, and 36B which are in close proximity pairs 38, 40, 42, and 44. As will be discussed in more detail, nanowire filaments may be formed between conductors which are in close proximity. While it should be understood that the schematic illustrations in this specification are not drawn to scale, the conductors in a given close proximity pair 38, 40, 42, or 44 are spaced approximately sixty angstroms apart, although "close proximity" may also refer to smaller or larger spacings.

The conductors 30A-36B are formed on a substrate 46, which may be silicon or some other suitable microelectronic, micromechanical, or integrated circuit material, such as gallium-arsenide. Depending on the conductivity of the substrate 46, it may be desirable to form an insulating layer, such as an oxide layer, between the substrate 46 and the conductors 30A-36B to prevent shorting through the substrate 46. The conductors 30A-36B may be formed using lithographic techniques, with light-sensitive masks on the substrate 46, such as those used during semiconductor fabrication. The conductors 30A-36B may also be formed using nano-imprinting techniques, such as those disclosed in U.S. Pat. No. 6,432,740.

The conductors 30A-36B may be formed in a variety of shapes. In one embodiment, conductors 30A and 30B have pointed proximity surfaces 48 in the close proximity pair 38. In another embodiment, conductors 34A and 34B have rectangular proximity surfaces 50 in the close proximity pair 42. In yet another embodiment, conductors 36A and 36B have arcuate proximity surfaces 52 in the close proximity pair 44. Other shapes and geometries for the proximity surfaces may also be used. In addition to varying the geometry and shape of the conductors, the conductors do not have to be set one hundred eighty degrees apart as close proximity pairs 38, 42, and 44 are. The conductors 32A and 32B are an example of one embodiment of a close proximity pair 40 which are separated by an angle different from one hundred-eighty degrees. For the sake of simplicity, pointed conductors, like the pointed conductors 30A and 30B of FIG. 1 will be used in the following descriptions, however it should be understood that other types, shapes, and angles between conductors may be used as well, depending on the application.

FIG. 2A schematically illustrates, in a top view, one embodiment of close proximity conductors 30A, 30B on which an oxide 54 has been formed. The oxide 54 can be formed by growing an oxide layer from the conductor 30A, 30B materials, or by depositing the oxide 54. The oxide 54 should be formed such that the oxide 54 bridges the area between the close proximity conductors 30A, 30B to form an oxide junction 56. FIG. 2B schematically illustrates, in a top view, one embodiment of close proximity conductors 30A, 30B on which an oxide 58 has been formed by deposition. Again, the oxide 58 bridges the area between the close proximity conductors 30A, 30B to form an oxide junction 56. The oxide 54, 58 may take many shapes, depending on: a) whether masking is used, b) the shape of the close proximity conductors 30A, 30B, and c) the nature of the manufacturing process used to form the oxide 54,58. For simplicity, one type of oxide will be discussed with respect to each embodiment. It should be understood, however, that as long as the oxide 54, 58 forms an oxide junction 56, bridging the area between the close proximity conductors 30A, and 30B, the shape of the oxide 54, 58 and/or the method of forming the oxide 54, 58 may be varied, based on the requirements of a particular design. For example, the oxide 54 formation may completely cover the close proximity conductors 30A and 30B, thereby insulating the close proximity conductors 30A, 30B from other components which may be formed during later manufacturing stages.

FIG. 3 schematically illustrates one embodiment of a circuit 59 having a nanowire filament 60 which has been formed between close proximity conductors 30A and 30B, through the oxide junction 56. By applying varying and/or fixed voltages across the close proximity conductors 30A and 30B, a tunneling current may be created between the close proximity conductors 30A and 30B. If the tunneling current is large enough, a portion of the oxide junction 56 will melt due to an electro thermal reaction, and the metal material from the close proximity conductors 30A and 30B can migrate through the oxide junction 56 to form a nanowire filament 60. The nanowire filament 60 formed by electromigration is metallic, and composed of the same metal as the close proximity conductors 30A, 30B.

The nanowire filament 60 of FIG. 3 has a resistance which depends in part on: the metals which are in the close proximity conductors 30A and 30B; the geometry and angular relationship of the close proximity conductors 30A, 30B; the level of voltage applied across the close proximity conductors 30A, 30B during the fusing process; the duration which the voltage is applied to the close proximity conductors 30A, 30B during the fusing process; and any current limits which are placed on the voltage supply used for the fusing process.

As illustrated in the embodiment of FIG. 4A, the oxide 54 may be removed from the area surrounding 62 the nanowire filament 60. Alternately, as illustrated in the embodiment of FIG. 4B, more of the oxide 54, or all of the oxide 54 may be removed from the nanowire filament 60 and the close proximity conductors 30A and 30B. FIGS. 5A and 5B illustrate, in a side cross-sectional view, two possible embodiments of circuit 59 from FIGS. 4A and 4B, taken along section line 5-5. In the embodied circuit 59 of FIG. 5A, the nanowire filament 60 was formed substantially in contact with the substrate 46, so that the nanowire filament 60 is supported by the substrate 46, but open on the top and sides. In the embodied circuit 59 of FIG. 5B, the nanowire filament 60 is suspended between close proximity conductors 30A, 30B and is open above, below, and on the sides not touching the close proximity conductors 30A and 30B. In this case, the nanowire filament 60 was fused through the oxide 54 such that it was not in contact with the substrate 46. When the oxide 54 is removed from the area of the nanowire filament 60, a suspended nanowire filament 60 may be created. For simplicity, nanowire filaments 60 will be illustrated as being suspended from hereon, however, it should be understood that nanowire filaments 60 may also be supported in the embodiments discussed herein as well as with their equivalents.

FIG. 6 schematically illustrates an embodiment of a circuit 64 which is coupled to a controller 66 to form a sensor 68. The controller 66 may include a microprocessor, an Application Specific Integrated Circuit (ASIC), digital electronics, analog electronics, or any combination thereof. The sensor circuit 64 has a substrate 46, and a pair of close proximity conductors 30A, 30B coupled to the substrate 46. A nanowire filament 60 is coupled between the conductors 30A and 30B, and is formed according to an embodiment of actions previously described, or an equivalent embodiment. The nanowire filament 60, in the sensor circuit 64, is "functionalized. By "functionalization", what is meant includes the various processes by which a nanowire surface can be modified chemically or physically by application of a receptor species that promotes or suppresses chemical or electrical interaction with certain analytes 70. An "analyte" can be any substance in any form which is being tested, measured, monitored, detected, or screened-for. Functionalization results in a physically or chemically attached coating 72 that can be reactive or interactive with an analyte 70, wherein, upon reaction, a charge transfer occurs that can be sensed electrically. Alternatively, the coating 72 can be a dielectric layer that has been added to the surface of the nanowire filament 60 such that an altered free charge will attract or attach to an analyte 72. For example, as an analyte gets stuck to the surface of the dielectric layer, an unbalanced charge will induce a counter charge in the nanowire filament 60 which can then be sensed by controller 66. Among other methods, the controller 66 can monitor the electrical state of the nanowire filament 60 via measurement of the resistance, the capacitance, or even the complex impedance at a predetermined frequency. Although only one sensor circuit 64 is shown coupled to the controller 66, an array of sensor circuits 64 may be coupled to the controller 66 to increase the sensing surface area.

FIG. 7 illustrates an embodiment of actions which may be used to construct a treated nanowire filament. In a forming action, an oxide is formed 74 between close proximity contacts. In a fusing action, a nanowire filament is fused 76 through the oxide between the close proximity contacts. In a removing action, oxide is removed 78 to expose at least a portion the nanowire filament. In a treating action, the nanowire filament is treated 80 to sensitize the nanowire for at least one analyte.

FIG. 8 schematically illustrates an embodiment of a temperature measurement device 82. A controller 84 is coupled to a reference junction 86 and a sensing junction 88. The controller 84 may include a microprocessor, an Application Specific Integrated Circuit (ASIC), digital electronics, analog electronics, or any combination thereof. The sensing junction 88 is a bi-metallic junction between two dissimilar metals. This junction of dissimilar metals generates a small voltage which varies with temperature, and may be referred to as a thermocouple. By using various pairs of metals or alloys in a thermocouple, it is possible to measure a wide range of temperatures, for example from −270 degrees Celsius to 2500 degrees Celsius. Metals and alloys which may be used for thermocouple pairs are known to those skilled in the art. Metals will be referred-to for simplicity, but alloys may be used as well, and shall be included in the term "metal" or "metals".

The reference junction 86 is also a thermocouple junction, and is provided to avoid additional dissimilar thermocouples in the system where the sensing conductors contact the controller. A first sensing conductor 90 couples the controller 84 to a first side 92 of the sensing junction 88. The first sensing conductor 90 is made of a first metal, the same metal as first side 92 of the sensing junction 88 which it is connected to. A second sensing conductor 94 couples a second side 96 of the sensing junction 88 to a first side 98 of the reference junction 86. The second sensing conductor is made of a second metal, the same metal as the second side 96 of the sensing junction 88 and the first side 98 of the reference junction 86 to which it is connected. A third sensing conductor 100 couples a second side 102 of the reference junction 86 to the controller 84. The third sensing conductor 100 is made of the first metal, the same metal as the second side 102 of the reference junction 86 which it is connected to. Generally, the temperature measurement device 82 will see a voltage V1 between the first sensing conductor 90 and the third sensing conductor 100 which is proportional to the difference between the temperature of the sensing junction 88 and the temperature of the reference junction 86. By keeping the reference junction 86 at a known temperature, the known temperature and the voltage V1 can be used to calculate the temperature at the sensing junction 88. Such thermocouple calculation techniques are known to those skilled in the art.

FIG. 9 schematically illustrates an embodiment of a thermocouple reference junction 104 which may be held at a known temperature. In this embodiment of a thermocouple reference junction 104, a heat source 106 is coupled to a bimetallic nanowire filament 108. The bimetallic nanowire filament 108 is a thermocouple, and the heat source 106 is coupled to the bi-metallic nanowire filament 108 such that a calibrated or known amount of heat is delivered to the bimetallic nanowire filament 108. By keeping the reference junction 104 at a known temperature, it may be used with a sensing thermocouple junction 88 for temperature measurement.

FIGS. 10-11 schematically illustrate, in side cross-sectional view, an embodiment of a thermocouple reference junction 109 and an embodied method of making a thermocouple reference junction 109. A resistor layer 110 may be deposited on a substrate 112. For example, the substrate 112 may be silicon with a layer of silicon dioxide, and the resistor layer 110 may be tantalum-aluminum. Contacts 114A and 114B may be formed on the resistor layer 110, leaving an area 116 of the resistor layer 110 uncovered by the contacts 114A, 114B. The thickness of the resistor layer 110 may be adjusted to achieve the desired resistance in the area 116 between the contacts 114A, 114B. Current applied between contacts 114A and 114B can cause the resistor in area 116 to heat to a repeatable and known temperature. Thus, a reliable small scale heat source may be created using semiconductor processes.

An oxide layer 118 may be formed over the contacts 114 and the exposed resistor area 116 to electrically insulate those elements. A first conductor 120 may be formed of a first metal, and a second conductor 122 may be formed of a second metal, different from the first metal. Each of the conductors 120, 122 are formed as close proximity conductors to make a close proximity pair, similar to the descriptions relating to close proximity pairs in FIGS. 1-7. While the close proximity conductors in FIGS. 1-7 may be the same metal or different metals, the close proximity conductors 120 and 122 in FIGS. 10-11 must be different metals. An oxide junction 124 is formed between the bi-metallic close proximity conductors 120, 122. By applying varying and/or fixed voltages across the biHP metallic close proximity conductors 120 and 122, a tunneling current may be created between the bimetallic close proximity conductors 120 and 122. If the tunneling current is large enough, a portion of the oxide junction 124 will melt due to an electrothermal reaction, and the different metal materials from the close proximity conductors 120 and 122 can migrate through the oxide junction 124 to form a bimetallic nanowire filament 126 as illustrated in FIG. 11. The bimetallic nanowire filament 126 formed by electromigration is a thermocouple, and is composed of the metals found in the close proximity conductors 120, 122.

The thermocouple reference junction 109 of FIG. 11 may be used in a temperature measurement device 82, as illustrated in the embodiment of FIG. 12. A sensing junction 128 is provided. The sensing junction 128 may be formed similarly to the circuit 59 of FIG. 5B which was discussed previously. In this embodiment, the conductors 30A and 30B should be formed of different metals, so that the resultant nanowire filament 60 is a bi-metallic nanowire filament, and therefore a thermocouple.

The thermocouple reference junction 109 of FIG. 11 is coupled to the sensing junction 128 in FIG. 12. Both the reference junction 109 and the sensing junction 128 are coupled to the controller 84. A first sensing conductor 90 couples the controller 84 to a first side 92 of the sensing junction 128. The first sensing conductor 90 is made of a first metal, the same metal as close proximity conductor 30B in first side 92 of the sensing junction 128 which it is connected to. A second sensing conductor 94 couples a second side 96 of the sensing junction 128 to a first side 98 of the reference junction 109. The second sensing conductor 94 is made of a second metal, the same metal as close proximity contact 30A in the second side 96 of the sensing junction 128 and the same metal as close proximity contact 122 in the first side 98 of the reference junction 109 to which it is connected. A third sensing conductor 100 couples a second side 102 of the reference junction 109 to the controller 84. The third sensing conductor 100 is made of the first metal, the same metal as close proximity conductor 120 in the second side 102 of the reference junction 109 which it is connected to. Generally, the temperature measurement device 82 will see a voltage V1 between the first sensing conductor 90 and the third sensing conductor 100 which is proportional to the difference between the temperature of the sensing junction 128 and the reference junction 109. The reference junction 109 may be kept at a known temperature by heating the bimetallic nanowire filament 126 with the resistor 110 in area 116. The temperature of the nanowire filament 60 in sensing junction 128 can be calculated with the known temperature of the bi-metallic nanowire filament 126 and the voltage V1 between the first sensing conductor 90 and the third sensing conductor 100.

The temperature measurement device 82 embodied in FIG. 12 can be constructed at a relatively low cost and in a small package, due to the use of semiconductor processes in its manufacture. The heat source of the reference junction 109 has a fast turn-on response and stabilization time when activated, and is easily held at a constant, known temperature. While the nanowire filament 60 of the sensing junction 128 was illustrated as having no oxide layer surrounding the nanowire filament 60, it may be desirable in some applications to leave the junction oxide surrounding the nanowire filament 60, similar to the junction oxide 56 in embodiment of FIG. 3. The junction oxide may provide isolation and protection to the nanowire filament 60 if the sensing junction 128 is used in a chemically, mechanically, and/or environmentally harsh measurement area, while still allowing a thermal coupling of the nanowire filament 60 to the measurement area. Similarly, the nanowire filament 60 may be coated with a dielectric to provide electrical insulation, or coated with chemicals to provide chemical isolation when the device 82 is used in conductive or corrosive measurement areas.

With respect to the reference junction 109, when fusing the junction oxide 124 by applying a voltage across the close proximity contacts 120, 122 to form a bi-metallic nanowire filament 126, care must be taken that fusing does not occur through the insulating oxide 118 to the resistor layer 110. One way to avoid having to pay attention to this issue is by manufacturing a reference junction 130 such as the one embodied in FIG. 13.

FIG. 13 schematically illustrates, in side cross-sectional view, an embodiment of a thermocouple reference junction 130 and an embodied method of making a thermocouple reference junction 130. Close proximity conductors 132A and 132B are formed on an insulating substrate 134. The close proximity conductors 132A and 132B are made of different metals. A junction oxide 136 is formed between the close proximity conductors 132A, 132B, and then a voltage is applied across the close proximity conductors 132A, 132B to fuse a bimetallic nanowire filament 138 through the junction oxide 136. An insulating layer 140 is formed over the close proximity conductors 132A, 132B in order to prevent shorting to other conductive elements to be formed on the thermocouple reference junction 130. It may be desirable to form the insulating layer 140 at the same time as the formation of the junction oxide 136 if the insulating layer 140 and the junction oxide 136 are compatible materials. A resistor layer 142 may then be formed on the insulating layer 140 in proximity to the bi-metallic nanowire filament 138. Contacts 144A and 144B are formed on the resistor layer 142 to define a resistor area 146 which is coupled the bimetallic nanowire filament 138. Thus, this embodiment of a thermocouple reference junction 130 may be reliably heated to a repeatable temperature. This embodiment also has the advantage that the bimetallic nanowire filament 138 is fused prior to the formation of the heater resistor, so there is no risk of fusing to the resistor layer 142 during the manufacturing process.

The ultrasensitive properties of a nanowire sensing circuit may require precise measurements of small changes in resistance. FIGS. 14-15 schematically illustrate embodiments of a nanowire sensor circuit 148. Four nanowire filaments, 60A, 60B, 60C, and 60D may be formed between close proximity conductors 30A and 30B, 150A and 150B, 152A and 152B, and 154A and 154B, respectively, using the embodiments of methods previously discussed and their equivalents. Close proximity pairs 38, 156, 158, and 160 may be coupled to form a Wheatstone bridge 162. The resistances of nanowire filaments 60B, 60C, and 60D may be known through repeatable manufacturing processes. The nanowire filament 60A may be exposed or coupled to a testing or measurement environment. The resistance of the nanowire filament 60A may be affected by, and used to measure, a variety of environmental conditions as discussed throughout this specification. In another example, heat may affect the resistance of the nanowire filament 60A, causing the nanowire filament to behave as a thermistor. The circuit 148 can detect small changes in the resistance of the nanowire filament 60A, providing an apparatus and method for measuring temperature. In other situations, strains and stresses placed on the nanowire filament 60A, which may or may not be suspended between the close proximity conductors 30A and 30B, may change the resistance of the nanowire filament 60A. The circuit 148 can detect these small changes in resistance, thereby enabling nano-scale stress and strain gauging. In the nanowire sensing circuit 148 embodied in FIG. 15, the nanowire filament 60A has been functionalized by a coating 72, similar to the coating 72 described in the embodiment of FIG. 6. The coating 72 may selectively bond to or react with an analyte 70, thereby changing the resistance of nanowire filament 60A in response to a variety of environmental conditions. The circuit 148 can detect these small changes in resistance, thereby enabling microfluidic (gas or liquid), microchemical, and microelectrical monitoring, measurement, and detection.

In the embodiments of FIGS. 14 and 15, the Wheatstone bridge 162 may be monitored by a controller 164. Controller 164 may include a microprocessor, an Application Specific Integrated Circuit (ASIC), digital electronics, analog electronics, or any combination thereof. The Wheatstone bridge 162 has four nodes 166, 168, 170, and 172 where the four close proximity pairs 38, 156, 158, 160 are coupled. The sensing nanowire filament 60A is located between first node 166 and second node 170. The sensing nanowire filament may act as a first resistor, having an unknown resistance. First known nanowire filament 60C is located between second node 170 and third node 168. The first known nanowire filament 60C may act as a second resistor, having a known resistance. The circuit path from first node 166, through second node 170, to third node 168 may be considered a first leg of the Wheatstone bridge 162. Second known nanowire filament 60B is located between first node 166 and fourth node 172. The second known nanowire filament 60B may act as a third resistor, having the known resistance. Third known nanowire filament 60D is located between fourth node 172 and third node 168. The third known nanowire filament 60D may act as a fourth resistor, having the known resistance. The circuit path from first node 166, through fourth node 172, to third node 168 may be considered a second leg of the Wheatstone bridge 162. A voltage 174 may be applied on one end of the Wheatstone bridge 162 at first node 166, while a ground 176 may be applied to another end of the Wheatstone bridge 162 at third node 168. The controller 164 may be coupled to the Wheatstone bridge 162 at second node 170 and at fourth node 172. In one example, assuming that the known resistances of nanowire filaments 60B, 60C, and 60D are equal, when the voltage the controller 164 measures at second node 170 equals the voltage the controller 164 measures at fourth node 172, the resistance of sensor nanowire filament 60A equals the resistance of one of the known resistances. If the voltage at the second node 170 is less than the voltage at the fourth node 172, the resistance of the sensor nanowire filament 60A is greater than the resistance of one of the known resistances, and can be calculated from Ohm's Law, looking at the current in the leg, and the voltage drop across the sensor nanowire filament 60A. On the other hand, if the voltage at the second node 170 is greater than the voltage at the fourth node 172, the resistance of the sensor nanowire filament 60A is less than the resistance of one of the known resistances, and can be calculated from Ohm's Law, looking at the current in the leg, and the voltage drop across the sensor nanowire filament 60A. Such calculations are known to those skilled in the art.

It is apparent that a variety of other structurally and functionally equivalent modifications and substitutions may be made to implement and manufacture nanowire filaments as well as implement and manufacture sensor circuits and integrated circuits employing nanowire filaments according to the concepts covered herein, depending upon the particular implementation, while still falling within the scope of the claims below.

What is claimed is:

1. A circuit, comprising:
   first and second close proximity metal conductors; and
   a nanowire filament fused between the close proximity conductors, the nanowire filament comprising a fusion of metal from the first close proximity conductor and metal from the second close proximity conductor.

2. The circuit of claim 1, wherein the nanowire filament is suspended between the close proximity conductors.

3. The circuit of claim 1, further comprising a substrate supporting the close proximity conductors, wherein the nanowire filament is supported by the substrate.

4. The circuit of claim 1, further comprising a junction oxide which is coupled to the nanowire filament.

5. The circuit of claim 1, further comprising a coating coupled to the nanowire filament.

6. The circuit of claim 5, wherein the coating is selected from the group consisting of dielectric coatings, reactive coatings, interactive coatings, and protective coatings.

7. The circuit of claim 1, wherein: the nanowire filament has a resistance; and the resistance of the nanowire filament changes with temperature.

8. The circuit of claim 1, wherein the close proximity conductors are at an angle other than one-hundred eighty degrees from each other.

9. The circuit of claim 1, wherein the close proximity conductors each comprise a close proximity surface which is selected from the group consisting of a pointed close proximity surface, a rectangular close proximity surface, and an arcuate close proximity surface.

10. The circuit of claim 1, wherein:
    the first proximity conductor comprises a first metal;
    the second proximity conductor comprises a second metal; and
    the nanowire filament fused between the close proximity conductors comprises a bi-metallic fusion of first metal from the first close proximity conductor and second metal from the second close proximity conductor.

11. A circuit, comprising a Wheatstone bridge having a first resistor of unknown resistance and second, third, and fourth resistors of known resistance, wherein the first resistor comprises the circuit of claim 1.

12. The circuit of claim 11, wherein the second, third, and fourth resistors each comprise the circuit of claim 4.

13. The circuit of claim 11, further comprising a functionalized coating on the first resistor nanowire filament.

14. A sensor, comprising an array of circuits, each circuit comprising the circuit of claim 1.

15. A thermocouple reference junction, comprising:
    a first close proximity conductor comprising a first metal;
    a second close proximity conductor comprising a second metal;
    a nanowire filament fused between the first and second close proximity conductors, the nanowire filament comprising a bi-metallic fusion of first metal from the first close proximity conductor and second metal from the second close proximity conductor; and
    a heat source coupled to the bi-metallic nanowire filament.

16. The thermocouple reference junction of claim 15, further comprising a tunnel junction oxide coupled to the bi-metallic nanowire filament.

17. The thermocouple reference junction of claim 15, wherein the bimetallic nanowire filament is coupled on top of the heat source.

18. The thermocouple reference junction of claim 15, wherein the heat source is coupled on top of the bi-metallic nanowire filament.

19. The thermocouple reference junction of claim 15, wherein the heat source comprises a heater resistor.

20. The thermocouple reference junction of claim 15, wherein the heater resistor comprises a thin-film resistor.

21. A temperature measurement device, comprising: a controller; a thermocouple sensing junction coupled to the controller; and a reference junction comprising the thermocouple reference junction of claim 15, wherein the reference junction is coupled to the controller and the sensing junction.

* * * * *

UNITED STATES PATENT AND TRADEMARK OFFICE
CERTIFICATE OF CORRECTION

| | | |
|---|---|---|
| PATENT NO. | : 7,294,899 B2 | Page 1 of 1 |
| APPLICATION NO. | : 11/142103 | |
| DATED | : November 13, 2007 | |
| INVENTOR(S) | : Neal W. Meyer et al. | |

It is certified that error appears in the above-identified patent and that said Letters Patent is hereby corrected as shown below:

On the Title page:
On page 2, item (56), under "U.S. Patent Documents", in column 2, line 13, delete "Lowis et al." and insert -- Lieber et al. --, therefor.

Signed and Sealed this

Eighteenth Day of November, 2008

JON W. DUDAS
*Director of the United States Patent and Trademark Office*